(12) United States Patent
Roohparvar

(10) Patent No.: US 8,837,189 B2
(45) Date of Patent: Sep. 16, 2014

(54) CONTENT ADDRESSABLE MEMORY

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 13/459,544

(22) Filed: Apr. 30, 2012

(65) Prior Publication Data
US 2012/0218822 A1 Aug. 30, 2012

Related U.S. Application Data

(62) Division of application No. 12/020,110, filed on Jan. 25, 2008, now Pat. No. 8,169,808.

(51) Int. Cl.
*G11C 15/00* (2006.01)
*G11C 16/04* (2006.01)
*G11C 15/04* (2006.01)

(52) U.S. Cl.
CPC .......... *G11C 16/0483* (2013.01); *G11C 15/046* (2013.01)
USPC ...................................... 365/49.1

(58) Field of Classification Search
USPC ......................................................... 365/49
See application file for complete search history.

(56) References Cited

U.S. PATENT DOCUMENTS

| 5,345,411 | A | * | 9/1994 | Yoneda ........................ 365/49.15 |
| 6,157,056 | A | * | 12/2000 | Takeuchi et al. .............. 257/315 |
| 6,240,003 | B1 | | 5/2001 | McElroy |
| 6,744,654 | B2 | | 6/2004 | Loughmiller |
| 6,785,153 | B2 | | 8/2004 | Regev et al. |
| 6,944,038 | B2 | | 9/2005 | de Sandre |
| 7,088,603 | B2 | | 8/2006 | Patel |
| 7,092,271 | B2 | | 8/2006 | Kaginele |
| 7,152,141 | B2 | | 12/2006 | Joshi |
| 2004/0240484 | A1 | * | 12/2004 | Argyres et al. ............... 370/535 |
| 2005/0166102 | A1 | | 7/2005 | Damon |

OTHER PUBLICATIONS

Pagiamtzis and Sheikholeslami, "Content-Addressable Memory (CAM) Circuits and Architectures: A Tutorial and Survey." IEEE Journal of Solid-State Circuits, vol. 41, No. 3, Mar. 2006.

Miwa, et al. "A 1-Mb 2-Tr/b Nonvolatile CAM Based on Flash Memory Technologies." IEEE Journal of Solid-State Circuits, vol. 31, No. 11, Nov. 1996.

http://en.wikipedia.org/wiki/Content-addressable_memory, "Content-addressable memory", Date accessed: Mar. 1, 2007, 1:29 AM.

http://pagiamtzis.com/cam/camintro.html, "Introduction to Content-Addressable Memory (CAM)", Date accessed: Mar. 1, 2007, 1:29 AM.

Examiner Interview Summary in parent U.S. Appl. No. 12/020,110, signed by attorney Thomas W. Leffert, Dec. 14, 2011 (2 pgs.).

* cited by examiner

*Primary Examiner* — Anthan Tran
(74) *Attorney, Agent, or Firm* — Dicke, Billig & Czaja, PLLC

(57) ABSTRACT

NAND architecture non-volatile content addressable (CAM) memory devices and methods are described that allows for high density, low cost CAM devices. In addition, the NAND architecture non-volatile CAM memory operates with reduced power consumption characteristics for low power and portable applications. In one NAND architecture non-volatile CAM memory embodiment a wired NOR match line array is utilized. In another embodiment a NAND match line array is shown. In yet other embodiments, hierarchal addressing, hash addressing, tree search and algorithmic/hardware engine based search is detailed utilizing both conventional NAND architecture non-volatile Flash memory arrays and dedicated NAND architecture CAM arrays utilizing wired NOR and wired NAND match lines.

27 Claims, 7 Drawing Sheets

CONTENT ADDRESSABLE MEMORY

RELATED APPLICATION

This is a divisional application of U.S. patent application Ser. No. 12/020,110, titled "NAND FLASH CONTENT ADDRESSABLE MEMORY," and filed Jan. 25, 2008 (allowed), now U.S. Pat. No. 8,169,808 which is commonly assigned and incorporated by reference in its entirety herein

TECHNICAL FIELD OF THE INVENTION

The present embodiments relate generally to memory devices and in particular to EEPROM, Flash and Content Addressable Memory (CAM) memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. Memory devices that do not lose the data content of their memory cells when power is removed are generally referred to as non-volatile memories. Two such forms of non-volatile memory are EEPROM (electrically erasable programmable read-only memory) and Flash memory, that are special type non-volatile ROM that is non-volatile but where individual cells can be programmed and erased (by individual cell erasure for EEPROM and "block" erasure for Flash) by exposing their cells to an electrical charge.

Memory devices typically read or write data in reference to an address or location associated with the data, which is input to the memory device at the time of the data access. Another form of memory device is content addressable memory (CAM), also known as associative memory or associative storage. In content addressable memory, the data itself is utilized to access the contents memory array, in effect performing a search of the data contents. This contrasts with the conventional approach of utilizing a known address to access the location storing the data in a memory. CAM memories generally utilize all or part of the contents of the data, accessing the data location by matching (typically in a simultaneous search) the data value in the array. A binary CAM searches for the 1's and 0's of each bit position in the input data, while ternary CAM devices allow search for 1's, 0's and don't cares ("X") to match each bit position in the input data. Once a match is found, CAM memory returns the address(es) of the match(es) or, alternatively, additional associated data stored with the match. If no match is found, the CAM indicates this with a signal or data return stating that no matching data was located. This allows CAM to be utilized as a hardware-based search device in applications that require fast searches or pattern matching, such as in databases, image or voice recognition, biometrics, data compression, cache memory controllers, or computer and communication networks (i.e., in a network switch or media access controller (MAC)).

Because a CAM is designed to quickly search its memory array in a single operation, it is much faster than equivalent memory and/or processor based data searches. CAM memory devices, however, are complex, volatile, require relatively large amounts of power to operate, and are typically of limited storage capacity. This high cost, complexity, high power usage, and low storage is particularly becoming an issue as CAM devices are utilized in modern applications that are storing increasing amounts of data and/or are operating with lower power or battery powered devices.

For the reasons stated above, and for other reasons stated below which will become apparent to those skilled in the art upon reading and understanding the present specification, there is a need in the art for large capacity, low cost CAM memory devices and arrays.

DETAILED DESCRIPTION

Figure 1:
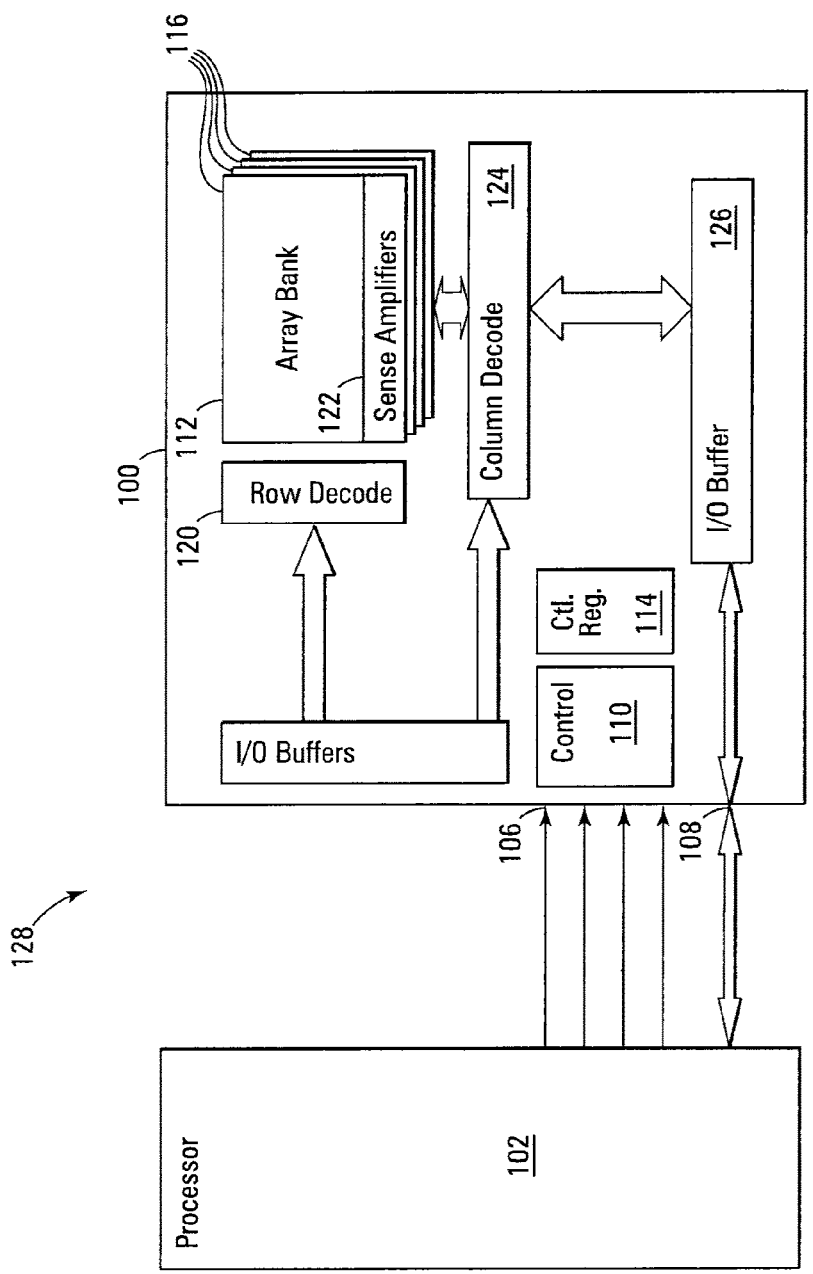
FIG. 1 is a simplified block diagram of a system containing a non-volatile CAM memory device with a NAND architecture Flash memory array in accordance with an embodiment of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Embodiments of the present invention include CAM memory devices and arrays utilizing non-volatile NAND memory cell strings in both conventional NAND architecture EEPROM/Flash arrays and dedicated parallel search NAND architecture CAM arrays. This allows CAM memory devices and arrays of embodiments of the present invention to have a high amount of data storage and comparison capability while maintaining the low power and non-volatile characteristics of NAND architecture EEPROM/Flash memory. CAM memory embodiments of the present invention are particularly advantageous in high information content pattern matching and/or low power or portable applications.

As stated above, in CAM memory devices the data itself is utilized to access the contents memory array, performing a search of the data contents. This is contrasted with conventional memory access that utilizes a known address to access the location storing the data in a memory. CAM memories generally utilize all or part of the contents of the data, accessing the data location by matching the input data value in a search of the array. Binary CAMs store 1's and 0's in each memory cell of the CAM array, while ternary CAMs (or TCAMs) store 1's, 0's and don't cares ("X") in each memory cell structure of the CAM array (therefore typically requiring 2-bits of storage in each TCAM cell). CAM memory devices then search the data words stored in the memory array by applying the input data word to the CAM cells of each data word to try to find a data word match for each bit position in the input data. Because of this emphasis on searching, various CAMs also incorporate comparators in each memory cell of each stored data word to allow comparison of the stored data words against the input data word in a parallel manner. Once a match is found, CAM memory returns the address of the match and/or a match indication to the host system. If no match is found, the CAM indicates this with a signal or data return stating that no matching data was located. Some CAM memory devices allow an ability to indicate that multiple matches are found and/or incorporate a prioritizer circuit to select the match with the highest priority.

In addition to returning a data match indication, CAM memory devices also typically return the address of the matching data in the CAM array or some other location indicator to the host system. Alternatively, additional data associated/stored with the matching data can also be returned with the match indication, such as a cache address in the translation look aside buffer of a cache memory. As indicated above, this search ability allows CAM to be utilized as a hardware-based search device in applications that require fast searches or pattern matching, such as in databases, image or voice recognition, biometric searches (such as finger print or iris recognition), data compression, cache memory controllers, or computer and communication networks (i.e., in a network switch or media access controller (MAC)). Prior art CAM memory devices, however, typically are complex due to their storage cell structure which typically have comparators built in to them to allow parallel search and are based on static or dynamic RAM technology, requiring large amounts of power to operate and leading to limited storage capacity due to this complexity.

An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. A typical floating gate memory cell/non-volatile memory cell is fabricated in an integrated circuit substrate and includes a source region and a drain region that is spaced apart from the source region to form an intermediate channel region. A conductive floating gate, typically made of doped polysilicon, or non-conductive charge trapping layer (a floating node), such as nitride (as would be utilized in a silicon-oxide-nitride-oxide-silicon or SONOS gate-insulator stack), is disposed over the channel region and is electrically isolated from the other cell elements by a dielectric material, typically an oxide. For example, a tunnel oxide that is formed between the floating gate/node and the channel region. A control gate is located over the floating gate/node and is typically made of doped polysilicon or metal. The control gate is electrically separated from the floating gate/node by another dielectric layer. Thus, the floating gate or charge trapping layer/floating node is "floating" in dielectric so that it is insulated from both the channel and the control gate. Charge is transported to or removed from the floating gate or trapping layer by specialized programming and erase operations, respectively, altering the threshold voltage of the device.

Yet another type of non-volatile memory is a Flash memory. A typical Flash memory comprises a memory array, which includes a large number of memory cells. Each of the memory cells includes a floating gate or charge trapping layer embedded in a field effect transistor (FET) transistor. The cells are usually grouped into sections called "erase blocks." Each of the cells within an erase block can be electrically programmed by tunneling charges to its individual floating gate/node. Unlike programming operations, however, erase operations in Flash memories typically erase the memory cells in bulk erase operations, wherein all floating gate/node memory cells in a selected erase block are erased in a single operation. It is noted that in recent Flash memory devices multiple bits have been stored in a single cell by utilizing multiple threshold levels or a non-conductive charge trapping layer with the storing of data trapped in a charge near each of the sources/drains of the memory cell FET.

An EEPROM or Flash NAND array architecture arranges its array of non-volatile memory cells in a matrix of rows and columns, as a conventional NOR array does, so that the gates of each non-volatile memory cell of the array are coupled by rows to word lines (WLs). However, unlike NOR, each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity. It is noted that other non-volatile memory array architectures exist, including, but not limited to AND arrays, OR arrays, and virtual ground arrays.

It is noted, while various embodiments of the present invention are described in relation to non-volatile NAND architecture EEPROM, NAND architecture Flash memory, and/or dedicated NAND architecture non-volatile memory cell transistor CAM memory and arrays, that virtual ground and multiple bit/multiple level cell (MLC) embodiments of the present invention are also possible and will be apparent to those skilled in the art with the benefit of the present invention. It is also noted that embodiments of the present invention include all non-volatile memory cells (also referred to herein as non-volatile memory cell transistors) that trap charge in an electrically isolated region (such as charge trapping/floating node memory cells) and are not limited to floating gate/node transistor based memory devices.

FIG. 1 details a simplified diagram of a system 128 with a CAM memory device 100 embodiment of the present invention connected to a host 102, which is typically a processing device or memory controller. The CAM memory 100 incorporates a conventional NAND architecture EEPROM or Flash array 112. The CAM memory 100 also has a control interface 106 and an address/data interface 108 that are each connected to the processing device 102 to allow memory read and write accesses and search data input. It is noted that in alternative embodiments, the address/data interface 108 can be divided into separate interfaces. Internal to the CAM memory device a control state machine/control circuit 110 directs the internal operation of the NAND architecture Flash array based CAM memory and CAM searches of the array 112. The RAM control registers and tables 114 are utilized by the control state machine 110 for temporary storage and device management during operation of the memory 100. The NAND architecture non-volatile memory array 112 contains a sequence of memory banks or segments 116, each bank 116 is organized logically into a series of erase blocks (not shown). Conventional memory access addresses are received on the address/data interface 108 of the non-volatile CAM memory 100 and divided into a row and column address portions. On a read access of the array 112, the row address is latched by the interface I/O buffer 104 and decoded by row decode circuit 120, which selects and activates a row page (not shown) of memory cells and the other memory cells in their associated strings across a selected memory bank. The bit values encoded in the output of the selected row of memory cells are connected from a local bitline/string (not shown) to a global bitline (not shown) and detected by sense amplifiers 122 associated with the memory bank. The sense amplifiers 122 also typically include a data cache and write data latch circuits (not shown). Data comparators may also be incorporated into the sense amplifier circuits 122 to aid searches and data verification of write operations. The column address of the access is also latched by the interface I/O buffer 104 and decoded by the column decode circuit 124. The output of the column decode circuit selects the desired column data from the sense amplifier outputs. In a conventional Flash memory read access or during the output of a CAM search match, the sense amplifier outputs 122 are connected to the data buffer 126 for data transfer from the memory device 100 through the address/data interface 108. On a write access the row decode circuit 120 selects the row page and column decode circuit selects write sense amplifiers 122. Data values to be written are connected from the data buffer 126 to the data cache and then to the write data latches of the write sense amplifiers 122 selected by the column decode circuit 124 and written to the selected non-volatile memory cells (not shown) of the memory array 112. The written cells are then reselected by the row and column decode circuits 120, 124 and sense amplifiers 122 so that they can be read to verify that the correct values have been programmed into the selected memory cells. It is noted that in one embodiment of the present invention, the column decode 124 may be optionally placed between the memory array 112 and the sense amplifiers 122.

As stated above, in the NAND array 112, the memory cells of the memory array are arranged in a matrix similar to conventional RAM or ROM, such that the gates of each memory cell of the array are coupled by rows to word lines (WL). However each memory cell is not directly coupled to a source line (SL) and a column bit line (BL), as would be the case in the NOR architecture style. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

Figure 2:
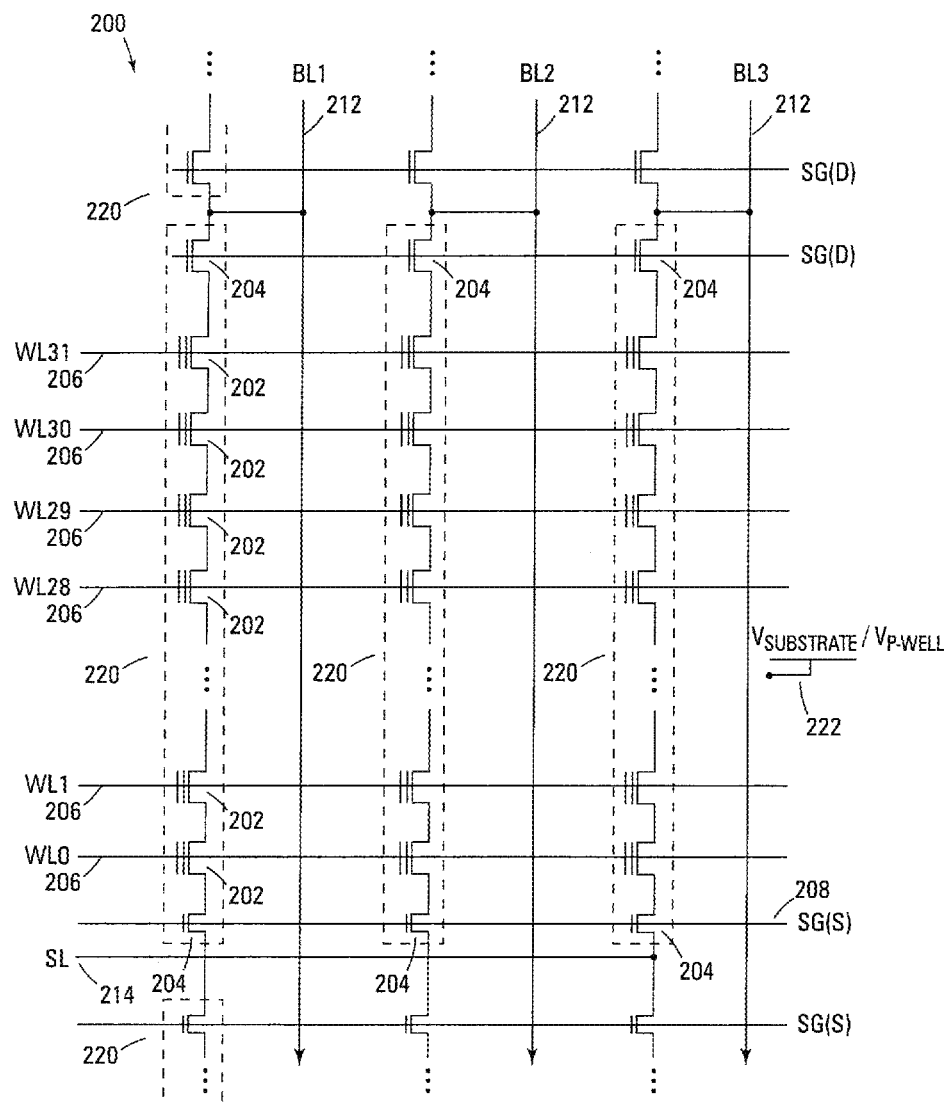
FIG. 2 is a simplified block diagram of a NAND architecture Flash memory array in accordance with an embodiment of the present invention.

FIG. 2 shows a schematic of a simplified NAND architecture floating node or trapping layer memory array 200 of an embodiment of the present invention. It is noted that the memory array 200 of FIG. 2 is for illustrative purposes and should not be taken as limiting. In FIG. 2, a series of NAND memory strings 220 are arranged in an array 200 and coupled to bit lines 212 and source lines 214. In each NAND memory string 220, a series of non-volatile memory cell transistors 202, such as floating gate or floating node memory cells, are coupled together source to drain to form the NAND string 220 (typically having 8, 16, 32, or more cells). As described above, each non-volatile memory cell FET 202 has a gate-insulator stack formed over the channel region. The word lines 206 couple across the NAND strings 220, coupling the control gates of adjacent memory cells 202 enabling a single memory cell 202 in each memory string 220 to be selected. In each NAND memory string 220, impurity (N+ typically) doped regions are formed between each gate insulator stack to form the source and drain regions of the adjacent memory cells 202, which additionally operate as connectors to couple the cells of the NAND string 220 together. Each NAND memory string 220 is coupled to select gates 254 that are formed at either end of each NAND string 220 and selectively couple opposite ends of each NAND string 220 to a bit line 212 and a source line 214. The select gates 204 are each coupled to gate select lines, select gate drain {SG(D)} 210 and select gate source {SG(S)} 208, that control the coupling of the NAND strings to the bit lines 212 and source lines 214, respectively, through the select gates 204. In FIG. 2, the substrate connection 222 is shown coupled to each NAND string 220, allowing the memory cells 202 of each NAND string 220 to be biased from the substrate.

A NAND architecture memory array is accessed by a row decoder activating a row of memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each non-volatile memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

Common programming technique for Flash/EEPROM memories programs a bit or row (commonly referred to as a page) of the memory by applying a programming voltage or series of programming voltage pulses to the control gates of the selected memory cells and then programming or inhibiting the selected memory cells to either programmed threshold level (typically to set at logical "0" by the injection of charge to the floating gate or floating node of a memory cell) or inhibited level (the cell is not programmed and left in its original state, usually intended to leave the cell erased and set at logical "1") by coupling the channels of the memory cells to either a program or inhibit voltage.

As stated above, in searching the conventional NAND architecture EEPROM or Flash array based CAM memory device 100 of FIG. 1, the control circuit 110 directs searches of the NAND architecture Flash memory array 112; internally accessing and retrieving stored data words from the NAND Flash memory array 112 and comparing them against the input search data. This search can be carried out by scanning the stored data words of the array 112 until a match is found. This scanning search, while slower than a parallel search of a dedicated CAM array, is faster than searching algorithmically with software utilizing an external processor. In addition, due to the large amount of data typically retrieved for each read access/page read of the array in modern NAND architecture Flash memory (for example, 2112 bytes or more), multiple data words can be retrieved at once to speed comparison. Burst reads, where sequential rows or pages of data are retrieved one after another from the NAND array 112, can also be utilized to speed searches, allowing the next page/row of data to be sensed while the current page is compared against the input search data for matches. In one embodiment of the present invention, comparators are incorporated in the sense amplifiers 122 or data buffer 126 to speed comparison of the retrieved data words and the input search data by comparing the retrieved data words of the accessed row/page and input search data in parallel. It is noted that this incorporation of comparators in the sense amplifiers or in the data cache allow, in effect, CAM binary or ternary memory cells to be formed by combining the storage of the accessed non-volatile memory cells of the Flash memory array and the comparators of the sense amplifiers or data cache, forming virtual CAM memory cells with the ability to compare their stored data with a bit position of the input data word with each selected row/page accessed from the array.

In another embodiment, the search of the NAND array 112 by the control circuit 110 is aided through use of pre-selection or pre-decoding of the input search data to select the section(s) or row(s) of the NAND array 112 that are to be scanned for data matches. This pre-selection or pre-decoding of the input search data is done under control of the control circuit 110 utilizing a hash algorithm of the input search data to select the NAND array sections to scan for data matches. Other pre-selection or pre-decoding algorithms include, but are not limited to, utilizing a binary search tree for selection of NAND array sections based on the input search data, sequential hierarchal tables that are utilized to match sequential segments of the input search data (where each table match links to the next table to match the next sequential input search data segment in) and utilizing a portion of the input search data as an address to pre-decode the address of the NAND array section to be searched. It is also noted that these pre-selection/pre-decoding methods can also be utilized to directly select the row/page from the NAND array 112 to search for data matches directly without needing to scan NAND array sections.

Figure 3A:
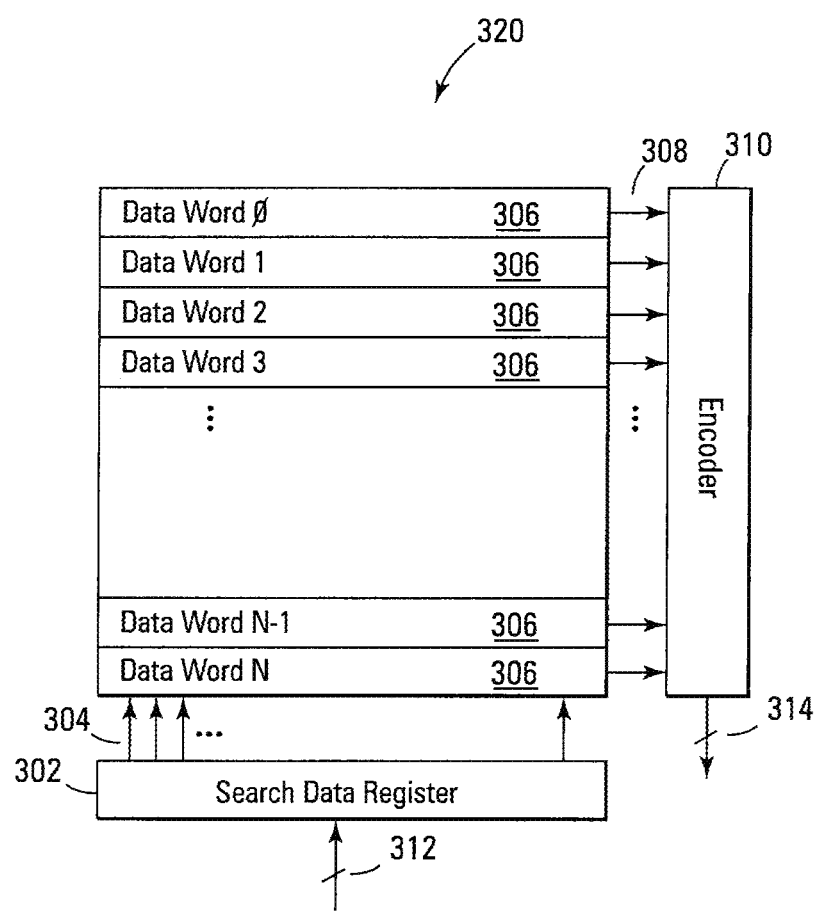
FIGS. 3A and 3B are simplified block diagram of a CAM array and a CAM memory in accordance with an embodiment of the present invention.

FIG. 3A details a dedicated CAM memory array of an embodiment of the present invention. In FIG. 3A, a parallel search CAM array 300 is shown having search lines 304 that couple the input data 312 from the search data register 302 (also known as the comparand register) to the stored data words 306. The CAM memory cells (not shown) contain both bit data storage and comparison circuitry to compare the stored bit to the data provided by the coupled search line 304. Match lines 308 couple the individual CAM cells (not shown) of the data words 306 of the array and indicate if the data word stored is a match for the input data. The match lines 308 are input to an encoder 310 that generates the address corresponding to the match location 314.

A search operation in the CAM array 300 is accomplished by coupling the input data 312 from the search data register 302 to the search lines 304, broadcasting the input data to the stored data words 306 of the parallel search CAM array. The CAM memory cells of each stored data word 306 compare the data bit position of the input data 312 that is placed on its coupled search line 304 to its stored data bit. If the data on the coupled search line 304 mis-matches with the stored data of the CAM memory cell, the cell pulls down the match line 308 coupled to the stored data word 306 in the CAM array 300. In operating the match line 308, the CAM memory cells can either be coupled to a single match line 308 running alongside the stored data word 306 so that they pull up or down the match line 308 to operate as an open collector wired NOR (or, alternatively, wired OR) function to express the data word match/non-match with the data stored in the CAM cells. Alternatively, the CAM memory cells can be serially daisy-chained together, with the output of one cell coupled to an input of the next cell in the chain, to express the data word match/non-match with the stored data as a wired NAND function (or, alternately, wired AND). If the data on the coupled search line 304 matches with the stored data, the CAM memory indicates the match on the coupled match line 308. If the CAM memory array 300 is a ternary array and a CAM memory cell of a stored data word 306 stores a "X" or don't care it for a given position, it will indicate a match for any bit data applied the cell as part of a search word. Thus, if a stored data word 306 matches the input data 312, its match line 308 will indicate a data match to the encoder 310. The encoder 310 then encodes a match/no-match indication for the search and outputs the address of matching data and any associated data for output 314 from the CAM memory.

Figure 3B:
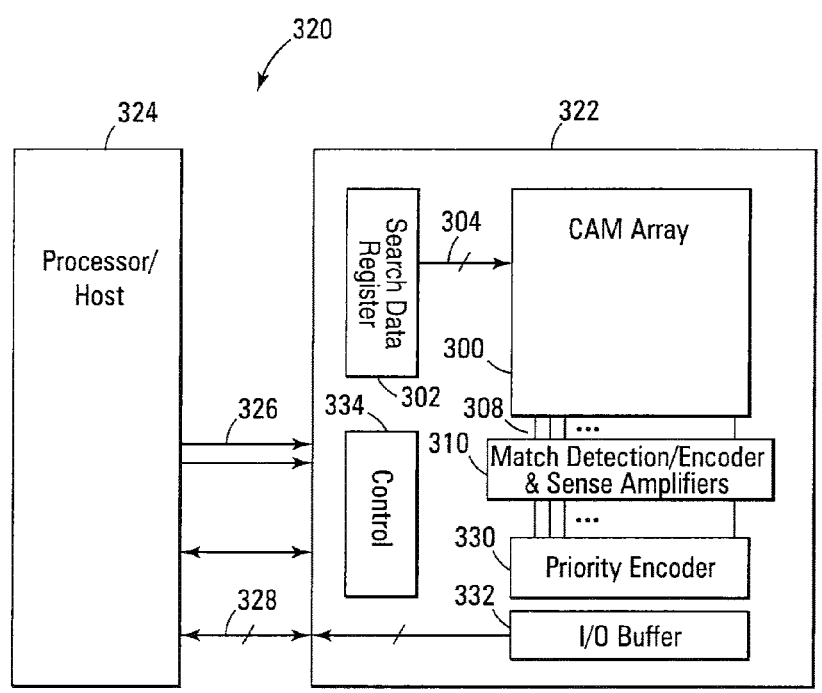

FIG. 3B details a simplified diagram of a system 320 incorporating a NAND architecture CAM memory device 322 of an embodiment of the present invention with a dedicated NAND architecture CAM array 300 connected to a host 324, such as a processing device or memory controller. The CAM memory 322 has a control interface 326 and an address/data interface 328 that are each connected to the host 324 to allow memory read and write accesses and search word input to the search data register 302. It is noted that in alternative embodiments, the address/data interface 328 can be divided into separate interfaces. In one embodiment, in addition to CAM searches being input, direct access to the NAND architecture CAM memory array 300 can also be allowed through the address/data interface 328. Data words are stored in the NAND architecture CAM memory device by being input to the address/data interface 328 and then stored in the NAND architecture CAM memory array 300 through either externally directed direct memory access or indirectly by operation of the CAM memory 322 internal circuits and algorithms which assign the CAM array 300 storage location for the data word. Internal to the CAM memory device a control state machine/control circuit 334 directs the internal operation; managing the CAM memory array 300 and updating control registers. In one embodiment, the control circuit 334 algorithmically conducts the search for a data match in the CAM array 300, or assists the hardware search of the CAM array 300 (such as, by pre-decoding the search word to a sub-portion of the CAM array 300).

As stated above, CAM searches are received on the address/data interface 328 of the CAM memory 322 and input to the search data register 302. In one embodiment, a mask for the search data can also be input to the CAM memory device 322 to allow the masking of selected bits of the input search data. In masking, the input data from the search data register 302 is modified by the mask data is coupled through the search lines 304 to CAM array 300. Data word matches are indicated on the match lines 308 and are detected by the sense amplifiers of the match detector/encoder 310. The one or more matches are output from the encoder 310 to the priority encoder 330, which selects a matching data word address based on the highest priority to place in the IO Buffer 332 for transfer back across the address/data interface 328 to the host 324. As stated above, various embodiments of the CAM memory 322 can also encode a match/no-match/multiple match signals for the search and/or output any associated data that is associated with the address of matching data from the CAM memory 322.

Figure 4A:
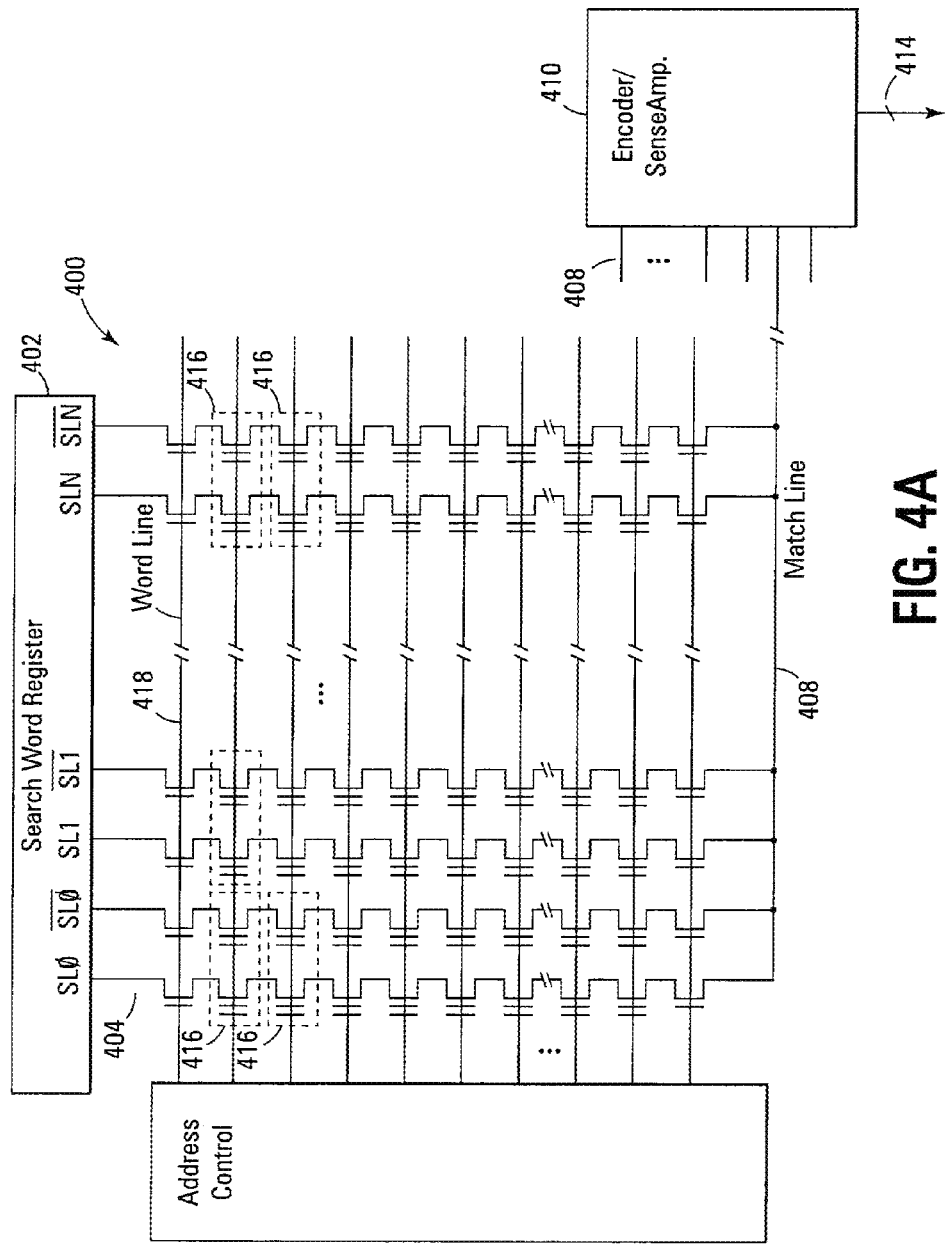
FIGS. 4A and 4B shows a diagram detailing NAND architecture CAM arrays according to embodiments of the present invention.
Figure 4B:
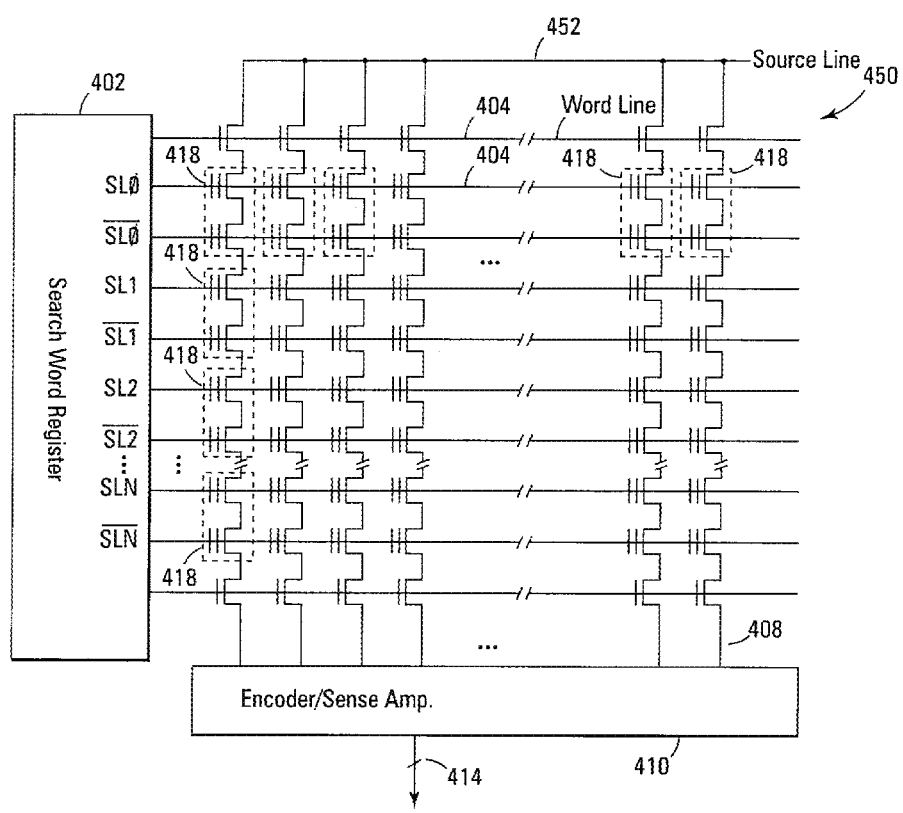

FIGS. 4A and 4B detail sections of NAND architecture CAM memory arrays of two embodiments of the present invention utilizing wired NOR match lines and wired NAND match lines.

In FIG. 4A, a section of a non-inverted logic NAND memory string CAM array 400 utilizing a wired NOR match line of an embodiment of the present invention is detailed. It is noted that the wired NOR match line CAM embodiments of the present invention can operate utilizing either inverted or non-inverted logic. It is also noted that various embodiments can also either precharge the match line or utilize a pull-up or pull-down circuit (not shown), such as a resistor or a weak transistor coupled to a power rail and the match line, to bring the match line to the desired high or low signal level before beginning a match operation.

In the non-volatile NAND architecture CAM array 400 of FIG. 4A, the memory cells of NAND architecture memory cell strings are arranged in rows and columns with their word lines coupled to an address control 420. The drain-side of each NAND string is coupled through a select gate to a common match line 408, while the source-side is connected through a select gate to complimentary search line bit position outputs 404 of the search word register 402. Non-volatile memory cell transistors from adjacent NAND memory strings are paired together to form ternary CAM memory cells 416. The encoder 410 senses the coupled match lines 408 and encodes a match/no-match indication for the search and outputs the address of matching data 414.

Data is stored in the CAM memory cells in a paired fashion. In storing data in the CAM memory cell 416, the non-volatile memory cell transistor of the NAND string coupled to the non-inverting search line (SLN) the CAM memory cell 416 is left erased and the non-volatile memory cell transistor of the NAND string coupled to the inverting search line (/SLN) is programmed to store a "1", the non-volatile memory cell transistor of the non-inverting search line (SLN) programmed and the non-volatile memory cell transistor of the inverting search line (/SLN) left erased to store a "0". In storing a "X" or don't care in the CAM memory cell 416, both transistors programmed. It is also noted that while the CAM memory cells are shown as being from adjacent NAND memory cell strings, there is no such physical requirement so long as the NAND memory cell strings containing individual non-volatile memory cell transistors of the CAM memory cell 416 are both coupled to the same match line 408 and to their respective inverted and non-inverted search lines 404 through their NAND strings.

The CAM memory cells 416 are accessed and a search performed by pulling up or precharging the match line 408 high and selecting a row storing a data word in the NAND architecture CAM array 400 for comparison to the data input to the search word register 402. The word line coupled to the non-volatile memory cell transistors of the selected row is driven with a read voltage and activating non-volatile memory cell transistors of the selected CAM memory cells 416 and word line. In addition, a pass voltage is placed on the unselected word lines and select gate transistors of the NAND strings, placing the unselected non-volatile memory cell transistors and select gate transistors in pass through mode. Each selected CAM memory cell 416 is also coupled through the source-side of its NAND string to search lines 404 that output an inverted and non-inverted signal for a bit position of the search data word register 402.

If a selected CAM cell 416 is programmed to store and match to a logical "1" and the data in bit position coupled to it is a logical "1", a high signal is expressed on the coupled non-inverting search line (SLN) 404 while a low is expressed on the coupled inverting search line (/SLN) 404. As the non-volatile memory cell of the CAM cell 416 coupled to the non-inverting search line (SLN) 404 has both its source and drain at a high voltage, it turns on and conducts. In addition, the non-volatile memory cell of the CAM cell 416 coupled to the inverting search line (/SLN) 404 has an elevated programmed threshold voltage and so also does not turn on and conduct. However, it is noted that, as the non-inverting search line is expressing a "1"/high signal state and the match line is precharged/pulled to a high signal state, it is not critical that the non-volatile memory cell coupled to the non-inverting search line 404 turns on and conducts even though it is in a low threshold voltage erased state and that in various embodiments the cell coupled to the non-inverting line 404 does not turn on and conduct even though it is in a low threshold voltage erased state. This conduction/non-conduction of the non-volatile memory cell transistors of the CAM cell 416 leaves the coupled match line in its pulled up/precharged high logic state. Similarly, if the selected CAM cell 416 stores a logical "0" and the data in bit position coupled to it is a logical "0", the erased non-volatile memory cell of the CAM cell 416 coupled to the inverting search line (/SLN) 404 will have both its source and drain at a high voltage and will conduct/not conduct, while the elevated threshold voltage of the programmed non-volatile memory cell of the CAM cell 416 coupled to the non-inverting search line (SLN) 404 prevents it from turning on and conducting. Or, if the selected CAM cell 416 stores a don't care "X" both non-volatile memory cells of the CAM cell 416 will be programmed and will not turn on and conduct. In both such cases the CAM memory cell 416 does not alter the high logic state pulled-up/precharged voltage on the coupled match line 408, indicating a match for the bit position.

If a selected CAM cell 416 stores a logical "1" and the data in bit position coupled to it is a logical "0", the non-volatile memory cell of the CAM cell 416 coupled to the non-inverting search line (SLN) 404 will have a low or erase state threshold voltage and thus turn on and conduct, coupling the match line 408 to the low or ground potential expressed on the non-inverting search line (SLN) 404. Similarly, if the selected CAM cell 416 stores a logical "0" and the data in bit position coupled to it is a logical "1" the erased non-volatile memory cell of the CAM cell 416 coupled to the inverting search line (/SLN) 404 is in a low threshold voltage/erased state and will conduct, coupling the match line 408 to a low or ground potential on the inverting search line (/SLN) 404. In such cases the CAM memory cell 416 alters the pulled up/precharged voltage on the coupled match line 408, coupling it to ground and indicating a mis-match for the bit position. It is noted that, in the CAM array 400 of FIG. 4A, the erased threshold voltage can be non-negative and should be low enough to allow conduction when the word line is selected with the read word line voltage, and the programmed threshold voltage should be high enough to assure non-conduction when a read word line voltage is applied.

In inverted logic wired NOR match line CAM embodiments of the present invention the operation of the non-inverting and inverting search lines 404 remains the same, while the match line is precharged or pulled-down to a low signal level before beginning a match operation and a match is signaled by the match line being pulled to a high logic state. Data is then stored in the inverted logic NOR match line CAM array CAM cells in an opposite manner to that of the non-inverted CAM cells—the non-volatile memory cell transistor of the NAND string coupled to the non-inverting search line (SLN) of the CAM memory cell 416 is programmed and the non-volatile memory cell transistor of the NAND string coupled to the inverting search line (/SLN) is left erased to store a "1", the non-volatile memory cell transistor of the non-inverting search line (SLN) left erased and the non-volatile memory cell transistor of the inverting search line (/SLN)

programmed to store a "0", and both transistors programmed to store an "X" or don't care in the CAM memory cell 416.

As data words are stored across a single word line of the NAND strings, the data words and their associated word lines need to be pre-selected or scanned during CAM searches. This pre-selection can be done under control of a CAM memory control circuit or algorithm, such as a hash algorithm, or be externally supplied to the CAM memory 400. Alternately, the selected word line can be decoded from bits of the data input to the search register 402 to pre-select the word line active for the search. In another embodiment, the word lines of the NAND strings of the CAM array 400 are scanned, such as by sequentially access, to search the data contents of the strings for a match to the input data in the search word register 402.

In FIG. 4B, a section of a non-inverted logic CAM array 450 utilizing a wired NAND match line of an embodiment of the present invention is detailed. In the non-volatile NAND architecture CAM array 450, the memory cells of NAND architecture memory cell strings are arranged in rows and columns with their word lines coupled to complimentary search line bit position outputs 404 of the search word register 402. The drain-side of each NAND string is coupled through a select gate to the encoder/sense amplifier 410, while the source-side is connected through a select gate to a common source line 452. In the NAND architecture CAM memory array 450, each NAND string stores a single data word in the string in vertical ternary CAM memory cells 418 formed from paired non-volatile memory cell transistors of the NAND string in a wired NAND daisy-chain configuration. The encoder 410 senses the output of each NAND string from the coupled match lines 408 and encodes a match/no-match indication for the search, outputting an address of matching data 414. It is also noted that, as with the wired NOR match line CAM, the wired NAND match line CAM embodiments of the present invention can operate in either an inverted or non-inverted logic configuration.

Data is also stored in the vertical CAM memory cells 418 of the CAM memory array 450 of FIG. 4B in a paired fashion, with the non-volatile memory cell transistor having the control gate/word line coupled to the non-inverting search line (SLN) being programmed (i.e., "programmed" so that it has a threshold voltage such that a higher pass voltage is required to be applied to the word line/search line to turn on the transistor and allow it to conduct) and the non-volatile memory cell transistor coupled to the inverting search line (/SLN) left erased (i.e., "programmed" and/or "erased" to a non-volatile cell threshold voltage, such that a lower voltage pass voltage can be applied to the word line/search line to turn on the transistor and allow it to conduct) to store a "1". The non-volatile memory cell transistor coupled to the non-inverting search line (SLN) left erased and the non-volatile memory cell transistor coupled to the inverting search line (/SLN) programmed to store a "0", and both transistors left erased to store a "X" or don't care. It is noted that the paired non-volatile memory cell transistors of the NAND string are not required to be arranged in adjacent pairs, so long as both are present in the same string and coupled to their respective inverting and non-inverting search line from the same bit position of the search word register 402.

The CAM memory cells 418 are accessed and a search performed by placing a high voltage on the source line 452 (it is noted that the source line 452 can be either commonly coupled to multiple NAND strings or to single NAND strings to allow individual control) and placing a pass voltage on the select gates of the NAND memory cell strings to operate them in pass through mode. The input data is then coupled from the search word register 402 through pairs of complimentary (inverting and non-inverting) outputs to search lines 404 coupled across to the control gates of the NAND memory strings.

If a bit position of the search word register 402 is searching for a logical "1" the non-inverting search line (SLN) 404 is coupled to a high pass voltage, while the inverting search line (/SLN) 404 is coupled to a low pass voltage. If the vertical CAM memory cell 418 of a NAND string coupled to these search lines 404 stores a logical "1" for the bit position, the high pass voltage will turn on the programmed non-volatile memory cell transistor coupled to the non-inverting search line (SLN) 404 and the low pass voltage turns on the erased non-volatile memory cell transistor coupled to the inverting search line (/SLN) 404, allowing current to pass through the CAM memory cell 418. If the vertical CAM memory cell coupled to the search lines 404 stores a logical "0", the high pass voltage will turn on the erased non-volatile memory cell transistor coupled to the non-inverting search line (SLN) 404 and the low pass voltage will fail to turn on the programmed non-volatile memory cell transistor coupled to the inverting search line (/SLN) 404, blocking current from passing through the CAM memory cell 418, and thus no current will flow in the NAND string the CAM memory cell 418 is a part of.

If a bit position of the search word register 402 is searching for a logical "0" the non-inverting search line (SLN) 404 is coupled to the low pass voltage and the inverting search line (/SLN) 404 is coupled to the high pass voltage. If the vertical CAM memory cell 418 coupled to these search lines 404 stores a logical "0", the low pass voltage will turn on the erased non-volatile memory cell transistor coupled to the non-inverting search line (SLN) 404 and the high pass voltage will also turn on the programmed non-volatile memory cell transistor coupled to the inverting search line (/SLN) 404, allowing current to pass through the CAM memory cell 418. If the vertical CAM memory cell coupled to the search lines 404 stores a logical "1", the low pass voltage will fail to turn on the programmed non-volatile memory cell transistor coupled to the non-inverting search line (SLN) 404 and the high pass voltage will turn on the erased non-volatile memory cell transistor coupled to the inverting search line (/SLN) 404, blocking current from passing through the CAM memory cell 418.

If the vertical CAM memory cell 418 coupled to the search lines 404 stores a don't care or "X", the high and low pass voltages will turn on both of the "erased" non-volatile memory cell transistors of the CAM memory cell 418, allowing current to pass through the CAM memory cell 418.

In a search operation, the match lines 408 are precharged or pulled down to a low logic state and the source line 452 coupled to logically high voltage, as noted above. If the stored data word of a NAND string match the input data of the search word register 402, all the CAM memory cells 418 are turned on and current is allowed to flow through the NAND string coupling the logical high voltage placed on the source line 452 to match line 408 to override the precharged/pulled down logic state of the match line, indicating a match, and is sensed by the encoder 410.

In inverted logic wired NAND match line CAM embodiments of the present invention the operation of the non-inverting and inverting search lines 404, as with the wired NOR embodiments, remains the same, while the source line 452 is coupled to a low logic voltage level and the match line is precharged or pulled-up to a high signal level before beginning a match operation. A match is then signaled by the match line being pulled to a low logic state. Data is stored in the CAM cells of the inverted logic NAND match line CAM array in the same manner as that of the non-inverted CAM cells—the non-volatile memory cell transistor of the CAM memory cell 418 coupled to the non-inverting search line (SLN) is programmed and the non-volatile memory cell transistor coupled to the inverting search line (/SLN) is left erased to store a "1", the non-volatile memory cell transistor of the non-inverting search line (SLN) left erased and the non-volatile memory cell transistor of the inverting search line (/SLN) programmed to store a "0", and both transistors left erased to store an "X" or don't care in the CAM memory cell 416.

It is also noted that masking of a bit position can be accomplished in wired NAND match line CAM array 450 of FIG. 4B regardless of the programmed or erased state the transistors of a coupled CAM cell 418 by expressing a high pass voltage on both the non-inverting and inverting search lines (SLN and /SLN) 404 coupled to it. It is further noted that stored data words can be invalidated or disabled by programming all the cells of the associated NAND string or by programming both cells of a single CAM cell 418 of the string.

Figure 5:
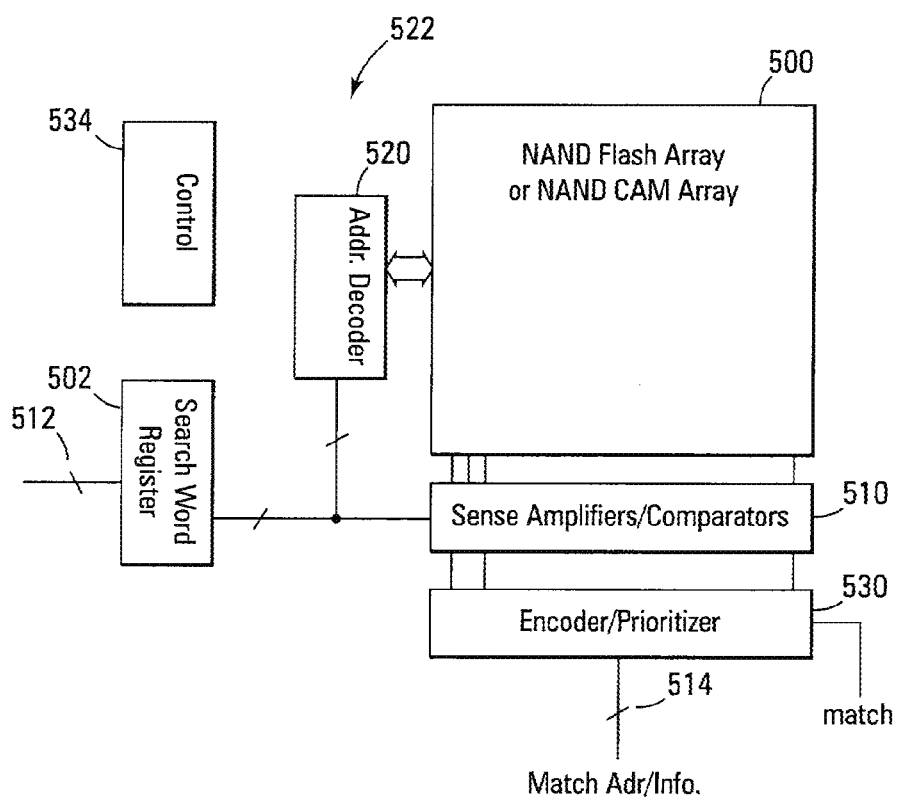
FIG. 5 details a NAND architecture CAM memory utilizing a hardware pre-decoding search architecture in accordance with an embodiment of the present invention.

In FIG. 5, a simplified block diagram of CAM memory device 522 is detailed that utilizes part of the data word to pre-select a portion of the memory array with a hardware decoder 520 to search for matches in. In FIG. 5, the memory array 500 can be either a dedicated NAND architecture CAM memory array with match line outputs that directly searches for the input search data word or a conventional NAND architecture Flash memory array where section are selected and searched for a match to the input search data word under control of the control circuit 534. As stated above, CAM searches are received on the address/data interface of the CAM memory 522 and input to the search data register 502. The input data, or a sub-portion thereof, is coupled to an address decoder 520 to select a section, page or row of the memory array 500 to search for the input data word held in the search data register 502. If the memory array 500 is a dedicated NAND architecture CAM array with match line outputs, such as detailed above, the search data is then input to the selected array portion with matching data words indicated on match lines that are sensed by the sense amplifiers 510. If the memory array 500 is a conventional NAND architecture Flash memory array, the selected array portion is then scanned as detailed above under control of the control circuit 534 for matches to the input search data word. In this, selected rows of memory cells are sensed by the sense amplifiers/comparators 510 and compared against the input search data word for match. In both embodiments, the sensed matches are then encoded and prioritized in the encoder/match prioritizer 530 for transfer from the CAM memory device 522 and/or indication of match/non-match/multiple match.

It is noted that the hardware based decoding/pre-selection of the memory array 500 based on the input data in the address decoder is not limited to decoding all or some of the input data as if it was a binary address (as in conventional memory addressing), but can include hardware based hash functions and other deterministic methods as detailed herein for selection of portions of the memory array 500 based on the input search data.

It is noted that other NAND architecture CAM memory devices, NAND architecture based CAM arrays and search operations for non-volatile memory device and array embodiments of the present invention are possible and will be apparent for those skilled in the art with the benefit of this disclosure.

CONCLUSION

NAND architecture non-volatile content addressable (CAM) memory devices and methods have been described that allow for high density, low cost CAM devices. In addition, the NAND architecture non-volatile CAM memory operates with reduced power consumption characteristics for low power and portable applications. In one NAND architecture non-volatile CAM memory embodiment a wired NOR match line array is utilized. In another embodiment a NAND match line array is shown. In yet other embodiments, hierarchal addressing, hash addressing, tree search and algorithmic/hardware engine based search is detailed utilizing both conventional NAND architecture non-volatile Flash memory arrays and dedicated NAND architecture CAM arrays utilizing wired NOR or wired NAND match lines.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A content addressable memory (CAM) device, comprising:
   a non-volatile memory array having a plurality of non-volatile memory cells arranged in a plurality of NAND architecture memory cell strings;
   a search word register having an inverting and non-inverting output for each bit position of the search word register, wherein each output of the search word register is coupled to a plurality of word lines of the plurality of NAND memory cell strings;
   a source line coupled to one or more source-side connections of the plurality of NAND memory cell strings; and
   a plurality of match lines, each match line coupled to a drain-side connection of a NAND string of the plurality of NAND strings;
   wherein each NAND memory cell string of the plurality of NAND memory cell strings stores a data word in a plurality of CAM memory cell structures and where each CAM memory cell structure is formed from a paired first and second non-volatile memory cells of the NAND memory cell string;
   wherein a control gate of the first non-volatile memory cell of each CAM memory cell structure is coupled to a non-inverting output of a selected bit position of the search word register and a control gate of the second non-volatile memory cell is coupled to an inverting output of a selected bit position of the search word register; and
   wherein the CAM memory device is adapted to couple a voltage of the source line through a NAND memory cell string to its coupled match line when a data word stored in the NAND memory cell string matches an input data word stored in the search word register.

2. The CAM memory device of claim 1, further comprising a sense amplifier/encoder coupled to the plurality of match lines to sense and encode a matching data word address from a match line indicating a matching data word is stored in a coupled NAND string.

3. The CAM memory device of claim 1, wherein a section of the non-volatile memory array to be scanned for matches is pre-selected based on the input data word.

4. The CAM memory device of claim 3, wherein the section of the non-volatile memory array to be scanned for matches is pre-selected based on the input data word is pre-selected by one of decoding all or some of the input data as a binary address, a hash algorithm decoding, a binary search tree, and sequential hierarchal table decoding with a hardware decoder circuit or a control circuit.

5. The CAM memory device of claim 1, further comprising:
an encoder/prioritizer circuit, wherein the encoder/prioritizer circuit is adapted to one or more of encode an address for a data match, indicate multiple matches, indicate a non-match, and select a priority match.

6. The CAM memory device of claim 1, wherein the CAM memory device is adapted to output additional associated data stored with data word that matches the input data word.

7. The CAM memory device of claim 1, wherein the CAM memory device is adapted to store ternary data in each CAM memory cell structure by:
programming a first non-volatile memory cell coupled to a non-inverting search word register output for a CAM memory cell structure for a bit position and leaving erased a second non-volatile memory cell coupled to an inverting search word register output for the bit position to store a "1" in the CAM memory cell structure;
leaving erased the first non-volatile memory cell coupled to the non-inverting search word register output for the bit position and programming the second non-volatile memory cell coupled to the inverting search word register output for the bit position to store a "0" in the CAM memory cell structure; and
leaving erased both the first and second transistors to store a "X" or don't care in the CAM memory cell.

8. The CAM memory device of claim 1, wherein the CAM memory device is adapted to mask the data stored in a selected CAM memory cell structure of a NAND memory cell string by driving the control gates of the first and second transistors with a pass voltage.

9. The CAM memory device of claim 1, wherein the CAM memory device is adapted to disable or invalidate a NAND memory cell string by programming both the first and second non-volatile memory cells of one or more CAM memory cell structures of the NAND memory cell string.

10. The CAM memory device of claim 1, wherein the CAM memory device is adapted to precharge or weakly pull a match line to a high or low logic signal.

11. A content addressable memory (CAM) device, comprising:
a non-volatile Flash memory array having a plurality of non-volatile memory cells arranged in rows and columns in a plurality of NAND architecture memory cell strings; and
a control circuit;
wherein the CAM memory device is adapted to search the non-volatile Flash memory array for a data word input to a search register to locate a match;
wherein a given bit position of the input data word corresponds to two of the non-volatile memory cells connected in series;
wherein a match for the input data word is indicated by a logic level of a match line; and
wherein the logic level of the match line is responsive to a current flow between one or more of the non-volatile memory cells and the match line.

12. The CAM memory device of claim 11, wherein the CAM memory device is adapted to search the non-volatile Flash memory array for a data word input to a search register to locate a match by scanning the Flash memory array to locate a matching data word and/or pre-selecting the section of the Flash memory array based on the input data word.

13. The CAM memory device of claim 12, wherein the CAM memory device is adapted to search the non-volatile Flash memory array for a data word input to a search register to locate a match by pre-selecting the section of the Flash memory array to scan based on the input data word by one of software pre-selection by the control circuit and hardware pre-decoding by decoder.

14. The CAM memory device of claim 12, wherein the CAM memory device is adapted to pre-select the section of the Flash memory array utilizing one of decoding all or some of the input data as a binary address, a hash algorithm decoding, a binary search tree, and sequential hierarchal table decoding.

15. The CAM memory device of claim 11, further comprising
a sense amplifier, wherein the sense amplifier has a comparator to compare one or more data words sensed from the non-volatile Flash memory array to a data word input to the search register.

16. The CAM memory device of claim 11, wherein the non-volatile memory cells for each bit position of the input data word are connected in series, and wherein the logic level of the match line is responsive to a current flow through the non-volatile memory cells for each bit position of the input data word.

17. A system, comprising:
a host coupled to a content addressable memory (CAM) device, where the CAM memory device comprises:
a non-volatile memory array having a plurality of non-volatile memory cells arranged in rows and columns in a plurality of NAND architecture memory cell strings, wherein a CAM memory cell corresponding to a bit position of a given data word comprises two of the non-volatile memory cells connected in series; and
a control circuit;
wherein the CAM memory device is adapted to search the non-volatile memory array for a data word input to a search register to locate a match;
wherein a match for the input data word is indicated by a logic level of a match line; and
wherein the logic level of the match line is responsive to a current flow between one or more of the CAM memory cells and the match line.

18. The system of claim 17, wherein the host is one of a processor and a memory controller.

19. The system of claim 17, wherein the non-volatile memory cells are one of non-volatile memory cells, multi-level cells (MLCs), and non-conductive floating node memory cells.

20. A method of operating a content addressable memory (CAM) device, comprising:
storing a plurality of data words in a plurality of NAND architecture memory cell strings of a NAND architecture Flash memory array, wherein a particular bit position of a particular data word corresponds to two non-volatile memory cells of one NAND architecture memory cell string connected in series;
accessing the plurality of NAND architecture memory cell strings of a NAND architecture Flash memory array to locate a match for an input data word in the plurality of stored data words with a control circuit of the CAM memory device; and
using current flow between one or more of the NAND architecture memory cell strings and a match line to indicate, by a logic level of the match line, whether a match for the input data word is located.

21. The method of claim 20, further comprising outputting one or more of a match address, a match location, a match/no-match indication signal, a multiple match indication signal, and associated information stored with a matching data word.

22. The method of claim 21, further comprising prioritizing a match address or location to output from the CAM memory device if two or more data words stored in the NAND architecture Flash memory array match the input data word.

23. The method of claim 20, further comprising pre-decoding the input data word to select a section of the non-volatile Flash memory array to search for the input data word, where the pre-decoding is one of decoding all or some of the input data as a binary address, a hash algorithm decoding, a binary search tree, and sequential hierarchal table decoding.

24. A method of operating a content addressable memory (CAM) device, comprising:
    storing a plurality of data words in a plurality of NAND architecture memory cell strings of a NAND architecture non-volatile memory array, where each data word of the plurality of data words is stored in a selected NAND architecture memory cell string of the NAND architecture non-volatile memory array in a plurality of CAM memory cell structures, each CAM memory cell structure having a first non-volatile memory cell and a second non-volatile memory cell coupled in the selected NAND architecture memory cell string; and
    comparing the plurality of stored data words to an input data word by,
    applying a voltage to a source line coupled to a source-side connection of the plurality of NAND memory cell strings of the NAND architecture non-volatile memory array,
    applying the input data word to a plurality word lines, each word line coupled to a plurality of memory cells of the plurality of NAND architecture memory cell strings, wherein a control gate of the first non-volatile memory cell of each CAM memory cell structure is coupled to a word line driven by an output of a selected bit position of the input data word and where a control gate of the second non-volatile memory cell is coupled to a word line coupled to an inverted output of the selected bit position of the input data word, and
    sensing a plurality of match lines coupled to a drain-side connection of the plurality of NAND architecture memory cell strings.

25. The method of claim 24, further comprising scanning a plurality of sections of the NAND architecture non-volatile memory array to locate a match to the input data word.

26. The method of claim 24, further comprising pre-selecting a section of the non-volatile memory array to be scanned for matches based on the input data word by one of decoding all or some of the input data as a binary address, a hash algorithm decoding, a binary search tree, and sequential hierarchal table decoding.

27. The method of claim 24, wherein storing each data word of the plurality of data words in a NAND architecture memory string of the NAND architecture non-volatile memory array in a plurality of CAM memory cell structures further comprises, for each CAM memory cell structure storing a bit position of the stored data word;
    leaving a first non-volatile memory cell for the bit position erased and programming a second non-volatile memory cell for the bit position to store a "0" in the CAM memory cell structure;
    programming the first non-volatile memory cell for the bit position and leaving erased the second non-volatile memory cell for the bit position to store a "1" in the CAM memory cell structure; and
    leaving both the first and second transistors erased to store a "X" or don't care for the bit position in the CAM memory cell structure.

* * * * *